United States Patent
Maetani

(10) Patent No.: US 8,324,508 B2
(45) Date of Patent: Dec. 4, 2012

(54) COMPOSITE CIRCUIT BOARD

(75) Inventor: Maraki Maetani, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 309 days.

(21) Appl. No.: 12/679,653

(22) PCT Filed: Mar. 27, 2009

(86) PCT No.: PCT/JP2009/056390
§ 371 (c)(1),
(2), (4) Date: Mar. 23, 2010

(87) PCT Pub. No.: WO2009/119849
PCT Pub. Date: Oct. 1, 2009

(65) Prior Publication Data
US 2010/0206625 A1    Aug. 19, 2010

(30) Foreign Application Priority Data

Mar. 28, 2008 (JP) ................................ 2008-088851

(51) Int. Cl.
*H05K 1/16* (2006.01)
(52) U.S. Cl. .................. 174/260; 174/261; 174/262
(58) Field of Classification Search .................. None
See application file for complete search history.

(56) References Cited

U.S. PATENT DOCUMENTS

| | | |
|---|---|---|
| 7,190,188 B2 | 3/2007 | Otsuka et al. |
| 7,417,195 B2 * | 8/2008 | Totani et al. .................. 174/255 |
| 2002/0179335 A1 * | 12/2002 | Curcio et al. ................. 174/265 |
| 2005/0040846 A1 | 2/2005 | Otsuka et al. |
| 2006/0202318 A1 * | 9/2006 | Satou et al. ................... 257/686 |
| 2007/0194433 A1 * | 8/2007 | Suwa et al. ................... 257/700 |

FOREIGN PATENT DOCUMENTS

| | | |
|---|---|---|
| JP | 01286493 A | 11/1989 |
| JP | 2005011627 A | 1/2005 |
| JP | 2005051496 A | 2/2005 |

OTHER PUBLICATIONS

International Search Report for corresponding International application PCT/JP2009/056390.

* cited by examiner

*Primary Examiner* — Ishwarbhai Patel
(74) *Attorney, Agent, or Firm* — DLA Piper LLP (US)

(57) ABSTRACT

A composite circuit board according to an embodiment of the invention includes a first circuit board having a first conductive line and a second conductive line which is longer in length than the first conductive line, and a second circuit board having a third conductive line which is electrically connected to the first conductive line and a fourth conductive line which is electrically connected to the second conductive line and is shorter in length than the third conductive line.

8 Claims, 4 Drawing Sheets

COMPOSITE CIRCUIT BOARD

CROSS-REFERENCE TO THE RELATED APPLICATIONS

This application is a national stage of international application No. PCT/JP2009/056390 filed on Mar. 27, 2009 and claims the benefit of priority under 35 USC 119 to Japanese Patent Application No. 2008-088851 filed on Mar. 28, 2008, the entire contents of which are incorporated herein by reference.

TECHNICAL FIELD

The present invention relates to a composite circuit board suitable for use in the mounting of a semiconductor integrated circuit which operates at high speed.

BACKGROUND ART

With the aim of achieving accurate and efficient transmission of high-speed high frequency signals, heretofore it has been customary to adopt a differential transmission line structure as an internal line structure of a packaging component for mounting and sealing a fast-operating semiconductor device such as IC and LSI or a surface-mount type electronic component. In a differential transmission line structure of conventional design, a pair of signal conductors are arranged side by side on a main surface of a dielectric substrate serving as a support and as an insulator as well.

In such a differential transmission line structure, a pair of signals in phase opposition are transmitted through a pair of signal conductors. This makes it possible to decrease an amplitude of each signal and thereby achieve the speeding up of data transmission and also cancellation of external noise.

Conventional differential transmission line structures are typically designed in the form of a parallel microstrip line, and more specifically a structure in which signal conductors are arranged side by side on a main surface of a dielectric substrate, or the form of a parallel strip line in which such a parallel arrangement of signal conductors assumes an internal layer pattern. In such constructions, however, since the signal conductors are opposed to each other at their side faces, it follows that its opposed area is so small that the electrical coupling established between the signal conductors tends to be not strong enough.

In order to achieve fine-pitch arrangement of electrode terminals in a semiconductor device, for example, in a multilayer circuit board composed of a plurality of dielectric layers, it is desirable to adopt a differential transmission line structure composed of a pair of signal conductors arranged face to face with each other in a direction of substrate thickness, with an intermediate dielectric layer interposed therebetween, this is, a broadside-coupled strip line.

In the case of adopting the broadside-coupled strip line, although the number of dielectric layers is inevitably increased, since the density of line in a state of being projected on the dielectric substrate main surface is equal to a single length of line, it is possible to achieve fine-pitch arrangement. Moreover, the opposed area between a pair of signal conductors can be increased. This makes it possible to render the electrical coupling between the signal conductors stronger than in the case of adopting the parallel microstrip line, and thereby improve the prospect of enhancement in cross talk characteristics (for example, refer to Japanese Unexamined Patent Publication JP-A 2005-51496).

Incidentally, in a packaging component or an electronic component, a pair of signal lines designed in internal layer pattern are led out to a substrate main surface via a through conductor. This makes it possible to establish electrical connection with an electrode terminal of a mounting circuit board.

However, in the case of adopting the broadside-coupled strip line, since the through conductors for use differ in height from each other, when a composite circuit board is constructed by mounting a packaging component or an electronic component on the mounting circuit board, considerable variations in line length will occur in the composite circuit board. This leads to an undesirable increase in the skew (propagation delay time difference) between differential signals that appears at the output end, which may result in degradation of transmission performance quality. Furthermore, as the signal speed is increased with consequent shortening of the wavelength of a propagating electromagnetic wave, the amount of phase shift is increased with respect to a single, common physical length. That is, the higher is the frequency level, the greater is the extent of skew.

DISCLOSURE OF INVENTION

An object of the invention is to provide a composite circuit board capable of reducing quality degradation of signals to be transmitted under a condition where a dielectric substrate formed with broadside-coupled strip lines is mounted on a mounting dielectric substrate.

A composite circuit board in accordance with one embodiment of the invention comprises a first circuit board and a second circuit board. The first circuit board includes a first conductive line and a second conductive line which is longer in length than the first conductive line. Moreover, the second circuit board includes a third conductive line which is electrically connected to the first conductive line and a fourth conductive line which is electrically connected to the second conductive line and is shorter in length than the third conductive line.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
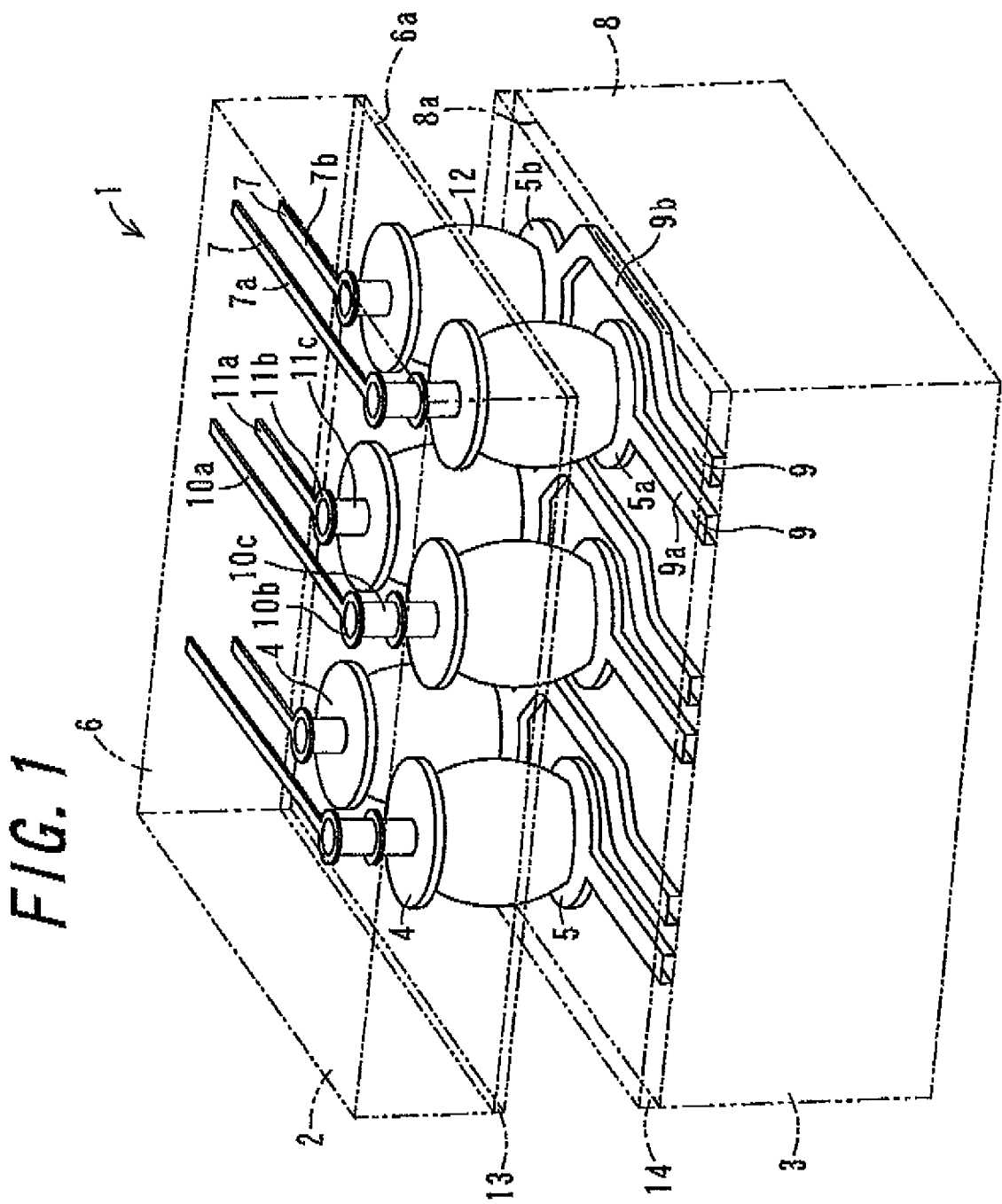
FIG. 1 is a perspective view showing a composite circuit board in accordance with one embodiment of the invention.
Figure 2:
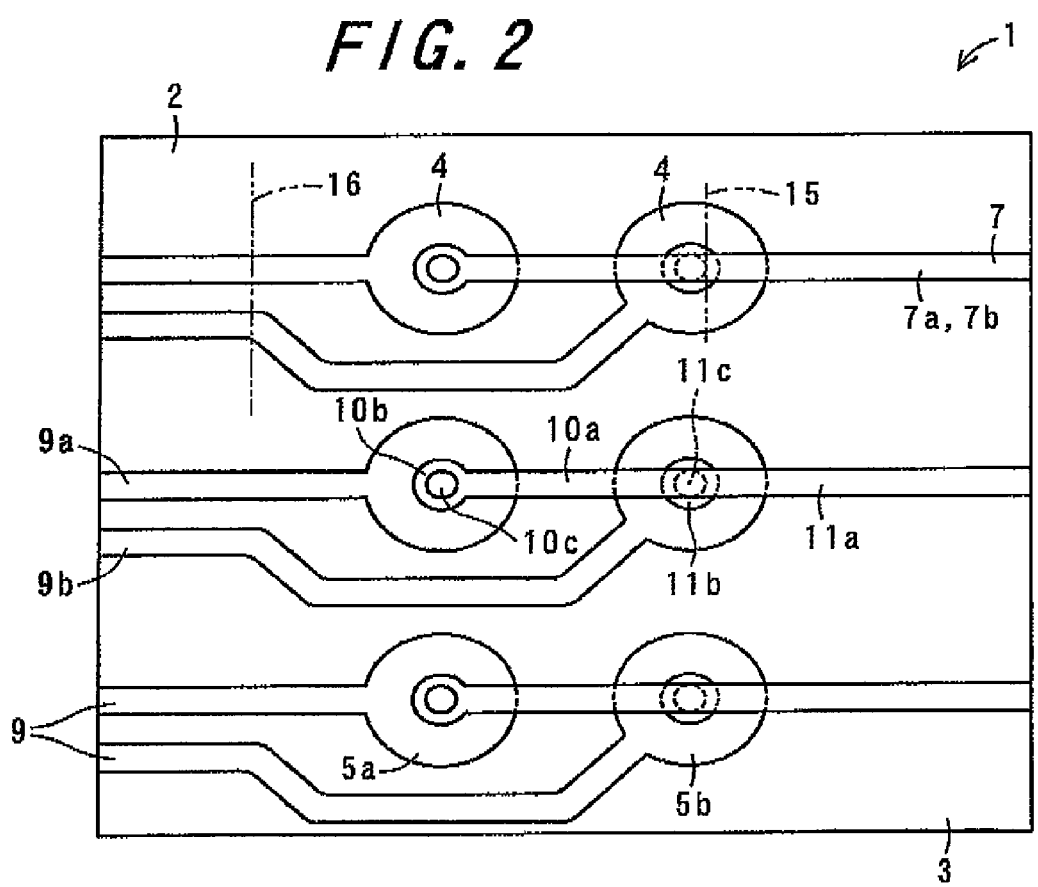
FIG. 2 is a plan view of the composite circuit board shown in FIG. 1.
Figure 3:
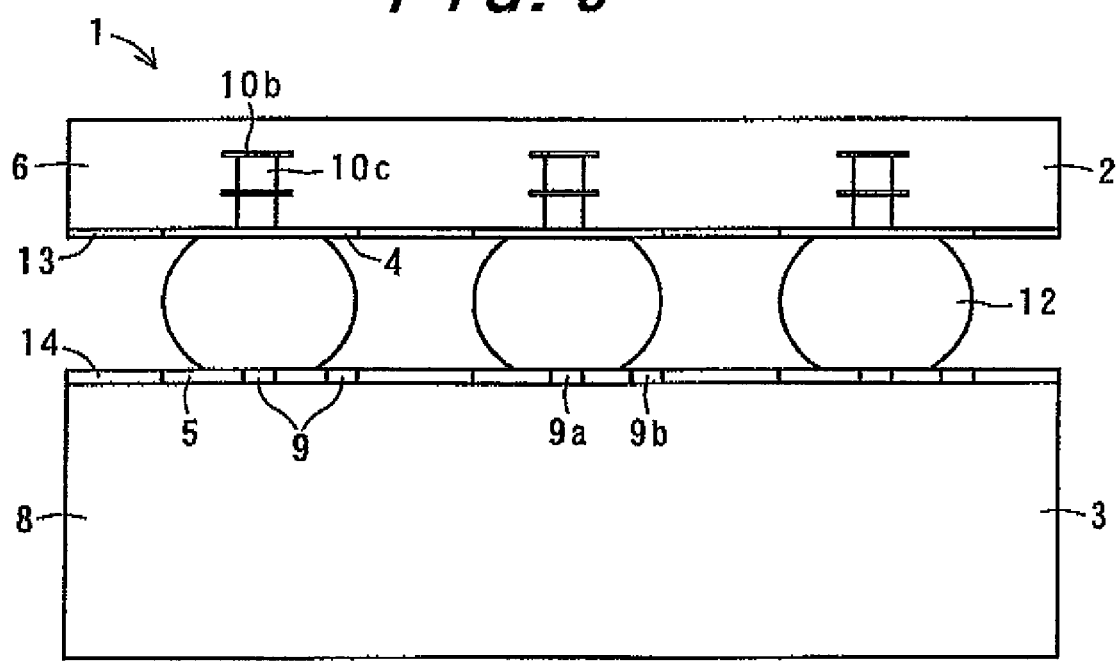
FIG. 3 is a front view of the composite circuit board shown in FIG. 1.
Figure 4:
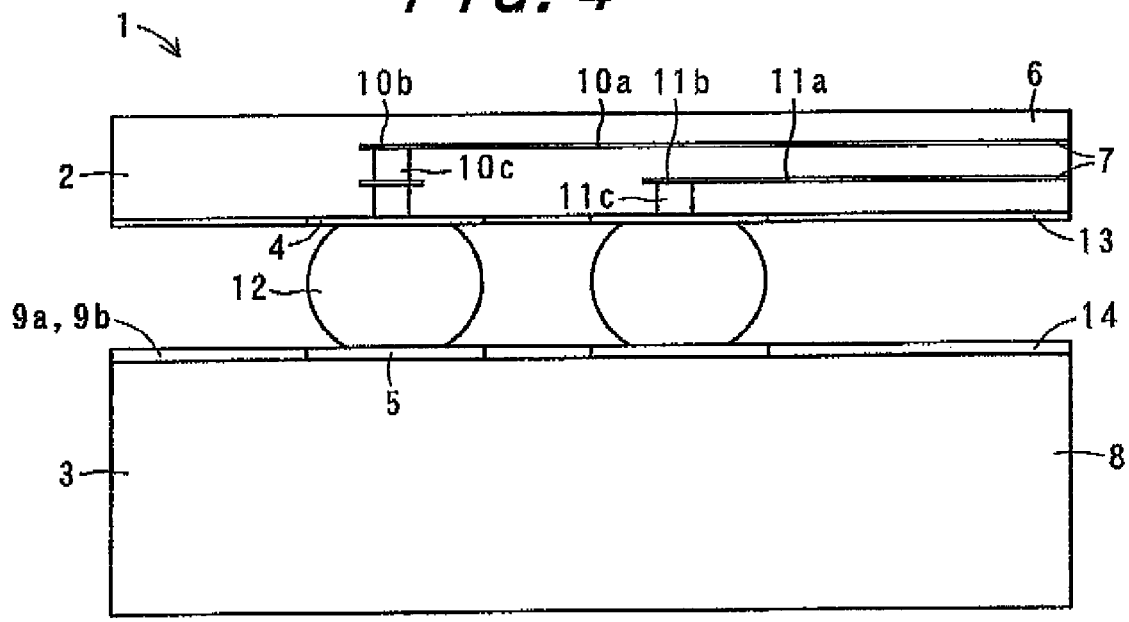
FIG. 4 is a side view of the composite circuit board shown in FIG. 1.

In order that the invention may be carried into effect, a plurality of embodiments thereof will now be described with reference to the accompanying drawings. Note that such constituent portions as are common to those of the preceding described embodiment will be denoted by the same reference symbols, and overlapping descriptions may be omitted. When the description of a given embodiment deals only with a part of its structure, then the other parts thereof will be deemed to be the same as that of the preceding described embodiment.

A composite circuit board 1 comprises a package 2 (a first circuit board) and a mounting board 3 (a second circuit board). In this construction, there are mounted circular connection pads 4 attached to the package 2 (a first end and a second end) and circular connection pads 5 attached to the mounting board 3 (a third end and a fourth end). The circular connection pad 4 and the circular connection pad 5 are electrically connected to each other by a solder ball 12.

The package 2 is the first circuit board having a dielectric layer 6 and an internal layered conductive line pair 7. The mounting board 3 is the second circuit board having a resin substrate 8 and a surface-layer line pair 9.

On the package 2 is mounted a non-illustrated semiconductor device. Moreover, the internal line of the semiconductor device and the internal layered conductive line pair 7 are connected to each other, so that a high-frequency signal can be transmitted through the internal layered conductive line pair 7. The internal layered conductive line pair 7 includes an internal layered conductive line 7b acting as the first conductive line and an internal layered conductive line 7a acting as the second conductive line, thereby constituting a differential transmission line structure.

Further, the internal layered conductive line 7b is composed of an internal-layer line 11a acting as a first internal layered conductive line, a land 11b, and a through conductor 11c acting as a first through conductor. Also, the internal layered conductive line 7a is composed of an internal-layer line 10a acting as a second internal layered conductive line, a land 10b, and a through conductor 10c acting as a second through conductor.

The internal layered conductive line pair 7, which is disposed inside the dielectric layer 6, is built as broadside-coupled strip lines opposed to each other in a thickness direction of the package 2. The internal-layer line 10a and the internal-layer line 11a are opposed to each other in the thickness direction, with a dielectric body interposed therebetween, and are so arranged as to overlap each other when viewed from the top face of the package 2.

In order to lead the internal layered conductive line 7a toward the connection pad 4, there is a need to form, at an end of the internal-layer line 10a, a vertical line portion which extends in the thickness direction for providing connection with the connection pad 4 by utilizing the land 10b and the through conductor 10c. Also, in order to lead the internal layered conductive line 7b toward the connection pad 4, there is a need to form, at an end of the internal-layer line 11a, a vertical line portion which extends in the thickness direction for providing connection with the connection pad 4 by utilizing the land 11b and the through conductor 11c.

However, for the attainment of the broadside-coupled strip line, the internal-layer line 10a and the internal-layer line 11a are arranged in line layers having different levels inside the dielectric layer 6. Therefore, the vertical line portion of the internal layered conductive line 7a composed of the land 10b and the through conductor 10c and the vertical line portion of the internal layered conductive line 7b composed of the land 11b and the through conductor 11c differ in length from each other.

In the internal layered conductive line 7b located near a main surface 6a (a first main surface) of the dielectric layer 6 on which is placed the connection pad 4, the vertical line portion composed of the land 11b and the through conductor 11c is made short. On the other hand, in the internal layered conductive line 7a located away from the main surface 6a of the dielectric layer 6, the vertical line portion composed of the land 10b and the through conductor 10c is made long.

Moreover, since the connection pads 4 are arranged side by side in an extending direction of the internal-layer line 10a and the internal-layer line 11a, it follows that the internal-layer line 10a is made longer than the internal-layer line 11a.

As employed herein, the "length" of a line refers to a distance from one external power input-output portion to the other external power input-output portion thereof. For example, in the case of FIG. 1, the length of the internal layered conductive line 7b acting as the first conductive line is the sum of the length of the through conductor 11c which is a distance from the connection pad 4 acting as the external power input-output portion to the semiconductor device mounting land 11b and the length of the internal-layer line 11a which is a distance from a boundary between the land 11b and the internal-layer line 11a to a part of connection with the semiconductor device. Moreover, the length of the internal layered conductive line 7a acting as the second conductive line is the sum of the length of the through conductor 10c which is a distance from the connection pad 4 to the semiconductor device mounting land 10b and the length of the internal-layer line 10a which is a distance from the boundary between the land 10b and the internal-layer line 10a to a part of connection with the semiconductor device.

In a case where a line is led toward the connection pad, as is often the case in the broadside-coupled strip line, the internal layered conductive line 7a and the internal layered conductive line 7b have different lengths, and this difference in line length results in a skew difference between differential signals as seen at the output end. In consequence, the high-frequency signal transmission performance quality will become deteriorated.

Meanwhile, referring to the drawings, in the mounting board 3, the surface-layer line pair 9 constitutes a differential transmission line structure.

In the mounting board 3, the connection pads 5 are placed on a main surface 8a (a second main surface) of the resin substrate 8. The connection pad 4 of the package 2 and the connection pad 5 of the mounting board 3 are electrically connected to each other by the solder ball 12. The high-frequency signal propagating through the internal layered conductive line pair 7 of the package 2 is then transmitted through the surface-layer line pair 9 via the connection pads 4 and 5 and the solder ball 12.

The surface-layer line pair 9 includes a surface-layer line 9a forming the fourth conductive line and a surface-layer line 9b forming the third conductive line, thereby constituting a parallel microstrip line.

In correspondence with the connection pads 4 of the package 2, the connection pads 5 connected with the surface-layer line pair 9 are arranged side by side in an extending direction of the surface-layer line 9a and the surface-layer line 9b. The surface-layer line 9a is connected to a connection pad 5a (the fourth end) situated toward the front as seen in the extending direction, whereas the surface-layer line 9b is connected to a connection pad 5b (the third end) situated toward the rear as seen in the extending direction. Note that, in this embodiment, the surface-layer line 9b and the connection pad 5b constitute the third conductive line, and the surface-layer line 9a and the connection pad 5a constitute the fourth conductive line.

The surface-layer line 9a and the surface-layer line 9b are arranged on the main surface 8a of the resin substrate 8. Accordingly, on the main surface 8a of the resin substrate 8, the surface-layer line 9a and the surface-layer line 9b extend in parallel with each other to a location short of the connection pad 5a. In the opposed region between the side faces of, respectively, the surface-layer lines 9a and 9b, high-frequency signals are transmitted in a differential manner under mutual electrical connection.

On the other hand, within a region from the location short of the connection pad 5a to the connection pad 5b, the surface-layer line 9b extend near the connection pad 5a while skirting there along, and the skirting surface-layer line 9b makes connection with the connection pad 5a.

Therefore, the surface-layer line 9b is made longer by the length of this extension resulting from the skirting than the surface-layer line 9a; that is, the surface-layer line 9a and the surface-layer line 9b differ in length from each other. Note that the length of the third conductive line is the length extending from one end of the surface-layer line 9b connected to the connection pad 5b to the center of the connection pad 5b located at the other end thereof. Moreover, the length of the fourth conductive line is the length extending from one end of the surface-layer line 9a connected to the connection pad 5a to the center of the connection pad 5a located at the other end thereof.

In this way, in the package 2, the attainment of the broadside-coupled strip line entails the difference in length between the internal layered conductive line 7a and the internal layered conductive line 7b due to their different levels. Moreover, in the mounting board 3, the surface-layer line 9a and the surface-layer line 9b differ in length from each other due to the positional difference between the connection pad 5a and the connection pad 5b.

By connecting the package 2 to the mounting board 3 in such a manner that the difference in length of the internal layered conductive line pair 7 in the package 2 and the difference in length of the surface-layer line pair 9 in the mounting board 3 cancel each other out, in the high-frequency signal transmission line as a whole that is constructed by combining together the internal layered conductive line pair 7 and the surface-layer line pair 9, it is possible to reduce the difference in line length between two high-frequency lines.

In order to cancel out the length difference between two line pairs, the internal layered conductive line 7a which is the longer one of the internal layered conductive line pair 7 and the surface-layer line 9a which is the shorter one of the surface-layer line pair 9 are connected to each other. Moreover, the internal layered conductive line 7b which is the shorter one of the internal layered conductive line pair 7 and the surface-layer line 9b which is the longer one of the surface-layer line pair 9 are connected to each other.

This makes it possible to render the sum of the length of the internal layered conductive line 7b acting as the first conductive line and the length of the surface-layer line 9b acting as the third conductive line substantially equal to the sum of the length of the internal layered conductive line 7a acting as the second conductive line and the length of the surface-layer line 9a acting as the fourth conductive line. As employed herein, the wording "substantially equal" means that the difference between the sums of length falls within 5% of the pulse width of an electric signal transmitted through the first to fourth conductive lines (or the period of analog waves).

Also in a case where the line composed of the internal layered conductive line 7b acting as the first conductive line and the internal layered conductive line 7a acting as the second conductive line, the third conductive line 9b, and the fourth conductive line 9a are made of the same material, the sums of the line lengths of them are substantially equal.

When viewed from the top face of the package 2 and the mounting board 3, the surface-layer line 9a, the internal layered conductive line 7a, and the internal layered conductive line 7b are arranged in the same straight line. The connection pad 5a and the connection pad 5b are also arranged in this straight line. Moreover, the internal layered conductive line pair 7, the surface-layer line pair 9, and the connection pads 4 and 5 are so arranged that the surface-layer line pair 9 connected with the connection pad 5 is opposite in extending direction to the internal layered conductive line pair 7 connected with the connection pad 4. Under this condition, the package 2 and the mounting board 3 are connected to each other.

Looking at the package 2 alone, it will be seen that there is a difference in length of the internal layered conductive line pair 7. Also, looking at the mounting board 3 alone, it will be seen that there is a difference in length of the surface-layer line pair 9. Meanwhile, in the composite circuit board 1 constructed by connecting the package 2 to the mounting board 3, it is possible to reduce the difference in line length between one high-frequency signal transmission line composed of the internal layered conductive line 7a and the surface-layer line 9a connected to each other, and the other high-frequency signal transmission line composed of the internal layered conductive line 7b and the surface-layer line 9b connected to each other. Their high-frequency signal transmission lines are formed to the differential transmission line structure. Accordingly, in the differential transmission line structure in itself, the high-frequency signal transmission performance quality can be improved.

The dielectric layer 6 of the package 2 can be made of any suitable dielectric material so long as it lends itself to use for the formation of an internal multilayer line structure. For example, an inorganic dielectric material such as ceramics and an organic dielectric material such as resin can be used. The specific examples thereof include: an inorganic material such as alumina ($Al_2O_3$) ceramics, mullite ($3Al_2O_3.2SiO_2$) ceramics, and glass ceramics; a fluorine resin material such as tetrafluoroethylene resin (polytetrafluoroethylene; PTFE), tetrafluoroethylene-ethylene copolymer resin (ethylene-tetrafluoroethylene copolymer; ETFE), and tetrafluoroethylene-perfluoroalkyl vinyl ether copolymer resin (perfluoroalkoxy alkane; PFA); and a resin material such as glass epoxy resin, polyphenylene ether (PPE) resin, liquid crystal polyester (LCP), and polyimide (PI). Moreover, in designing the dielectric layer 6, while the shape and dimensions thereof are determined arbitrarily in accordance with its applications, the thickness in particular is determined in accordance with transmission signal frequency and impedance design.

The internal layered conductive line pair 7 may be made of a metal conductor layer which lends itself to use for high-speed signal transmission. For example, in a case where a material of the dielectric layer 6 is made of ceramics, the following examples may be adopted for use in forming the conductor line: a material obtained by applying nickel plating and gold plating onto copper, molybdenum-manganese, tungsten, or a molybdenum-manganese metallized body; a material obtained by applying nickel plating and gold plating onto a tungsten metallized body; a material obtained by applying a nickel-chromium alloy and gold plating on tantalum nitride; and a material obtained by applying platinum and gold plating onto a nickel-chromium alloy. Moreover, as the method of manufacturing the line, for example, a thick film printing method, various thin film formation techniques, a plating processing method, or the like may be adopted for use as a method of construction. The width and thickness of each conductor line are determined in accordance with transmission signal frequency or impedance design.

While, as is the case with the present embodiment, the resin substrate 8 is used for the mounting board 3, the invention is not limited thereto. For example, just like the package 2, an inorganic dielectric material such as ceramics and an organic dielectric material such as resin can be used thereof.

As the electrically conductive member for providing electrical connection between the connection pads 4 and 5, in the present embodiment, a solder ball is used. Alternatively, any other electrically conductive member can be used so long as it lends itself to use for high-speed signal transmission. For example, a metal material such as gold, silver, and copper can be used. Moreover, the shape of the electrically conductive member is not limited to a ball shape, but may be of a columnar shape or a bump shape, for instance.

For example, the package 2 of the present embodiment is fabricated in the following manner. In a case where the dielectric layer 6 is made for example of alumina ceramics, at first, green sheets of alumina ceramics are prepared. The alumina ceramic green sheets are subjected to a predetermined punching processing to form through holes therein for the placement of the through conductors 10c and 11c. Next, a conductor paste of tungsten, molybdenum, or the like is charged into the through hole by means of screen printing. Moreover, conductor lines; that is, the patterns of the internal-layer line 10a, the internal-layer line 11a, the land 10b, and the land 11b are print-coated at predetermined locations of the green sheets. Then, the green sheets formed with their respective patterns are stacked on top of each other, and the stacked body is fired at a temperature of about 1600° C.

Moreover, the mounting board 3 is fabricated in the following manner. A copper-clad substrate is prepared by applying a copper foil on a surface of a glass epoxy substrate Grade FR-4, for example. Then, pattern formation for the paired outer layer-side line 9 and the connection pad 5 is performed on the copper foil by means of a known patterning technique such as etching.

On the main surface 6a of the dielectric layer 6 formed with the connection pad 4 and on the main surface 8a of the resin substrate 8 formed with the connection pad 5 are disposed solder resists 13 and 14, respectively.

The solder ball 12 is placed on the connection pad 5 of the mounting board 3, and the connection pad 4 of the package 2 is aligned with the corresponding connection pad 5. Then, the connection pads 4 and 5 and the solder ball 12 are bonded together by means of ultrasonic vibration, reflow technology, or otherwise.

As described heretofore, according to the present embodiment, the difference in length between the first conductive line and the second conductive line and the difference in length between the third conductive line and the fourth conductive line cancel each other out. Accordingly, in the composite circuit board as a whole, the length difference in the differential transmission line structure can be reduced. This makes it possible to reduce the difference in propagation delay time between differential signals under the state where the first circuit board is mounted on the second circuit board, and thereby reduce deterioration in transmission performance quality and quality degradation of signals to be transmitted.

According to the present embodiment, it is preferable that the sum of the length of the first conductive line and that of the third conductive line and the sum of the length of the second conductive line and that of the fourth conductive line are substantially equal. In this case, quality degradation of signals can be reduced more reliably.

According to the present embodiment, it is preferable that the first conductive line and the second conductive line are arranged inside the first dielectric substrate. In this case, by exploiting the effect of the dielectric material, the coupling between a pair of the differential lines can be strengthened and thus the diffusion of transmission energy can be suppressed, with the consequence that the cross talk between the pair of the differential lines and another pair of differential lines. Moreover, a broadside-coupled strip line can be practically realized with ease.

According to the present embodiment, it is preferable that the first conductive line includes the first internal layered conductive line disposed inside the first dielectric substrate and the first through conductor extending from an end of the first internal layered conductive line to the first end, and that the second conductive line includes the second internal layered conductive line which is disposed inside the first dielectric substrate so as to align partly with the first internal layered conductive line and is larger in line length than the first internal layered conductive line, and the second through conductor which extends from an end of the second internal layered conductive line to the second end and is larger in line length than the first through conductor.

In this way, the second conductive line is made longer than the first conductive line in terms of both through conductor and internal layered conductive line. That is, since the second conductive line can be located so as to cover the first conductive line, it follows that the electrical coupling between the first conductive line and the second conductive line can be strengthened.

According to the present embodiment, the first internal layered conductive line and the second internal layered conductive line are so arranged that mutual aligned regions thereof are overlapped when viewed from the top face of the first dielectric substrate. In this construction, it is possible to achieve a broadside-coupled strip line with ease by coupling the first internal layered conductive line and the second internal layered conductive line to each other and thereby strengthen the electrical coupling between the first conductive line and the second conductive line. It is also possible to reduce the area of space required for the placement of the first conductive line and the second conductive line, and thereby increase the line density.

According to the present embodiment, it is preferable that the first internal layered conductive line and the second internal layered conductive line are each linearly shaped. By doing so, it is possible to increase the opposed area between the first internal layered conductive line and the second internal layered conductive line arranged in an overlapping manner, and thereby enhance the electrical coupling between the first internal layered conductive line and the second internal layered conductive line.

According to the present embodiment, it is preferable that the fourth conductive line is linearly shaped, and that, when viewed from the top face of the first dielectric substrate, the fourth conductive line, the first internal layered conductive line, and the second internal layered conductive line are arranged in the same straight line.

Moreover, the area of space required for the placement of the first conductive line, the second conductive line, and the fourth conductive line can be reduced with consequent increase in the line density. Further, it is possible to allow easy mutual cancellation between the difference in line length between the first conductive line and the second conductive line and the difference in line length between the third conductive line and the fourth conductive line.

According to the present embodiment, it is preferable that the third end is further arranged in the same straight line described above. By doing so, it is possible to reduce the area of space required for the placement of the first to fourth conductive lines and thereby increase the line density.

According to the present embodiment, it is preferable to provide a parallel line portion disposed in parallel with the fourth conductive line, and an extension. With the provision of the extension, the third end and the fourth conductive line can be arranged in the same straight line with consequent increase in the line density.

According to the present embodiment, by virtue of the electrically conductive member, the first end and the third end, as well as the second end and the fourth end, can be mounted with ease.

According to the present embodiment, it is preferable that the first to fourth ends are each formed of a circular connection pad. By doing so, a spherical electrically conductive member such as a solder ball can be used.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A composite circuit board, comprising:
a first circuit board comprising
a first dielectric substrate,
a first conductive line which comprises a first internal-layer conductive line inside the first dielectric substrate and first through conductor located from an end of the first internal-layer conductive line to a first main surface of the first dielectric substrate, and
a second conductive line which comprises a second internal-layer conductive line inside the first dielectric substrate so as to align partly with the first internal-layer conductive line and a second through conductor located from an end of the second internal-layer conductive line to the first main surface; and
a second circuit board comprising
a second dielectric substrate,
a third conductive line which is electrically connected to the first conductive line, and
a fourth conductive line which is electrically connected to the second conductive line and is shorter than the third conductive line,
wherein the second internal-layer conductive line is longer than the first internal-layer conductive line, the second conductive line is longer than the first conductive line, and the third conductive line and the fourth conductive line are located on a same main surface of the second dielectric substrate.

2. The composite circuit board of claim 1, wherein
the first conductive line further comprises a first end which is located on the first main surface and is connected to the first through conductor,
the second conductive line further comprises a second end which is located on the first main surface and is connected to the second through conductor,
the third conductive line further comprises a third end which is located on a second main surface, one of main surfaces of the second circuit board, facing to the first main surface, and is electrically connected to the first end, and
the fourth conductive line further comprises a fourth end which is located on the second main surface and is electrically connected to the second end.

3. The composite circuit board of claim 2, further comprising:
a first conductive member configured to connect the first end and the third end; and
a second conductive member configured to connect the second end and the fourth end.

4. The composite circuit board of claim 2, wherein the first to fourth ends are each a circular connection pad.

5. The composite circuit board of claim 1, wherein the first internal-layer conductive line and the second internal-layer conductive line are so arranged that mutual aligned regions thereof are overlapped when viewed perspectively from a top face of the first dielectric substrate.

6. The composite circuit board of claim 1, wherein the first internal-layer conductive line and the second internal-layer conductive line are each conductive linearly shaped.

7. The composite circuit board of claim 1, wherein the fourth conductive line is conductive linearly shaped, and,
when viewed perspectively from a top face of the first dielectric substrate, the fourth conductive line, the first internal-layer conductive line and the second internal-layer conductive line are located in a same straight line.

8. The composite circuit board of claim 1,
wherein the third conductive line comprises
a parallel line portion in parallel with the fourth conductive line, and
an extension portion which is configured to make the third conductive line longer than the fourth conductive line.

* * * * *